(12) United States Patent
Liu et al.

(10) Patent No.: US 8,947,033 B2
(45) Date of Patent: Feb. 3, 2015

(54) DELAY CIRCUIT, FAN ASSEMBLY, AND ELECTRONIC DEVICE USING THE DELAY CIRCUIT

(71) Applicants: Hong Fu Jin Precision Industry (ShenZhen) Co., Ltd., Shenzhen (CN); Hon Hai Precision Industry Co., Ltd., New Taipei (TW)

(72) Inventors: Lei Liu, Shenzhen (CN); Guo-Yi Chen, Shenzhen (CN)

(73) Assignees: Hong Fu Jin Precision Industry (ShanZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 226 days.

(21) Appl. No.: 13/711,650

(22) Filed: Dec. 12, 2012

(65) Prior Publication Data

US 2013/0241457 A1  Sep. 19, 2013

(30) Foreign Application Priority Data

Mar. 15, 2012  (CN) .......................... 2012 1 0067659

(51) Int. Cl.
*H02P 1/00* (2006.01)
*H02P 1/04* (2006.01)
*H03K 5/159* (2006.01)

(52) U.S. Cl.
CPC . *H02P 1/04* (2013.01); *H03K 5/159* (2013.01)
USPC ............. 318/445; 318/62; 318/283; 318/285; 318/400.13; 361/695; 361/679.48; 361/679.6; 307/141

(58) Field of Classification Search
USPC ........... 318/62, 283, 285, 364, 365, 445, 452, 318/102, 400.13, 430; 361/695, 679.48, 361/679.6, 679.09, 679.22, 679.47; 712/202; 307/141
See application file for complete search history.

(56) References Cited

U.S. PATENT DOCUMENTS

2013/0038250 A1*  2/2013  Wu et al. ........................ 318/102

* cited by examiner

*Primary Examiner* — Antony M Paul
(74) *Attorney, Agent, or Firm* — Novak Druce Connolly Bove + Quigg LLP

(57) ABSTRACT

A delay circuit for a fan includes a signal generation circuit, a first switch, a delay microchip, and a second switch. The signal generation circuit receives a driving signal and generates a control signal according to the driving signal. The first switch is electronically connected to the signal generation circuit to receive the control signal. The second switch is electronically connected between the delay microchip and the fan. When the signal generation circuit is electronically connected to the fan via the first switch, the control signal is transmitted to the fan to activate the fan. When the signal generation circuit is electronically connected to the delay microchip, the delay microchip receives the control signal and outputs a delayed control signal after a predetermined delay time, and the delayed control signal is transmitted to the fan via the second switch to activate the fan.

20 Claims, 4 Drawing Sheets

US 8,947,033 B2

1

DELAY CIRCUIT, FAN ASSEMBLY, AND ELECTRONIC DEVICE USING THE DELAY CIRCUIT

BACKGROUND

1. Technical field

The disclosure generally relates to delay circuits, and particularly to a delay circuit for a fan and an electronic device using the delay circuit.

2. Description of the Related Art

Many electronic devices, such as servers, employ at least two fans for cooling. When the fans are started, a surge current may be generated. The surge current is often greater that a driving current of the fan. Thus, when the at least two fans are simultaneously started, instantaneous power consumption of the fans may reach one hundred watts, and then a power supply with high-power is needed, and the electronic devices may incur increased costs because of use of the power supply with high-power.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present embodiments.

DETAILED DESCRIPTION

Figure 1:
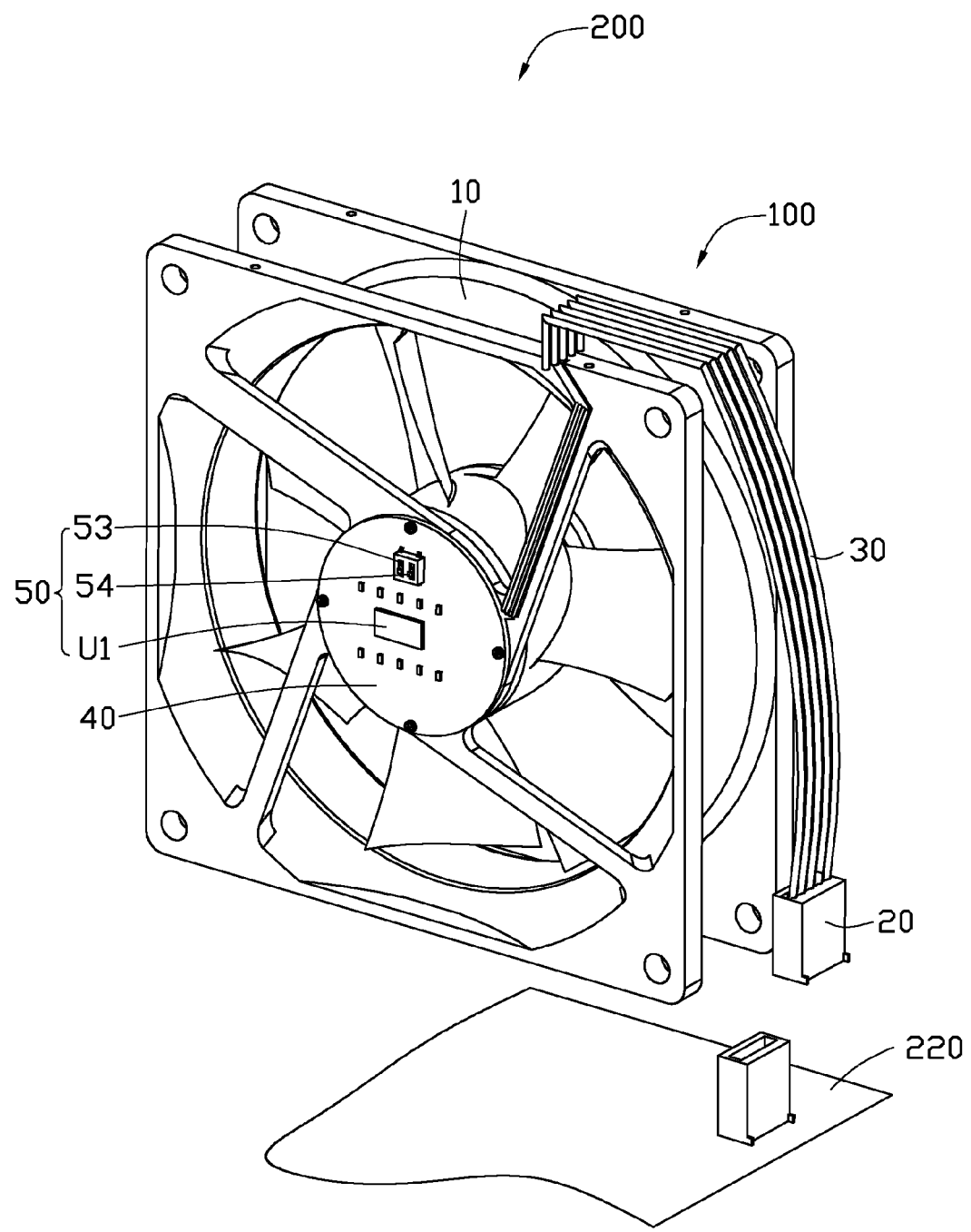
FIG. 1 is a schematic view of an electronic device including a fan assembly, according to an exemplary embodiment.

FIG. 1 shows a fan assembly 100, according to an exemplary embodiment. The fan assembly 100 can be assembled in an electronic device 200, such as a server. The electronic device 200 further includes a motherboard 220.

The fan assembly 100 includes a fan 10, a connector 20, a cable 30, a control board 40, and a delay circuit 50. The control board 40 is fixed to the fan 10, and the delay circuit 50 is integrated on the control board 40.

The connector 20 is formed on a first end of the cable 30, and is configured to connect to the motherboard 220 to receive drive signals, such as a voltage of about 12V, a detection signal for detecting a rotary speed of the fan 10, and a pulse width modulation (PWM) signal, for example. A second end of the cable 30 is electronically connected to the control board 40 and the fan 10. Thus, the delay circuit 50 can receive the voltage of about 12V and the PWM signal, and the fan 10 can receive the detection signal.

Figure 2:
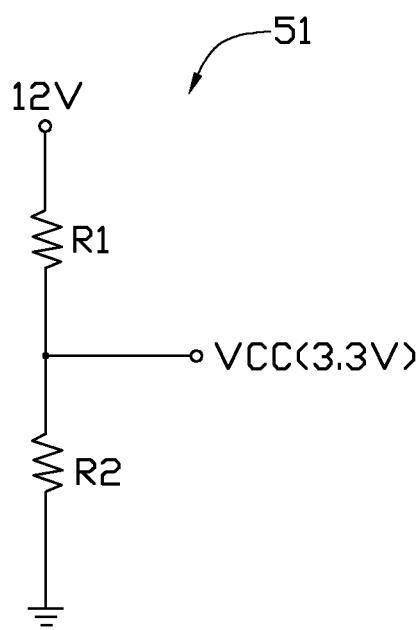
FIG. 2 is a circuit view of a voltage conversion circuit of the fan assembly as shown in FIG. 1.
Figure 3:
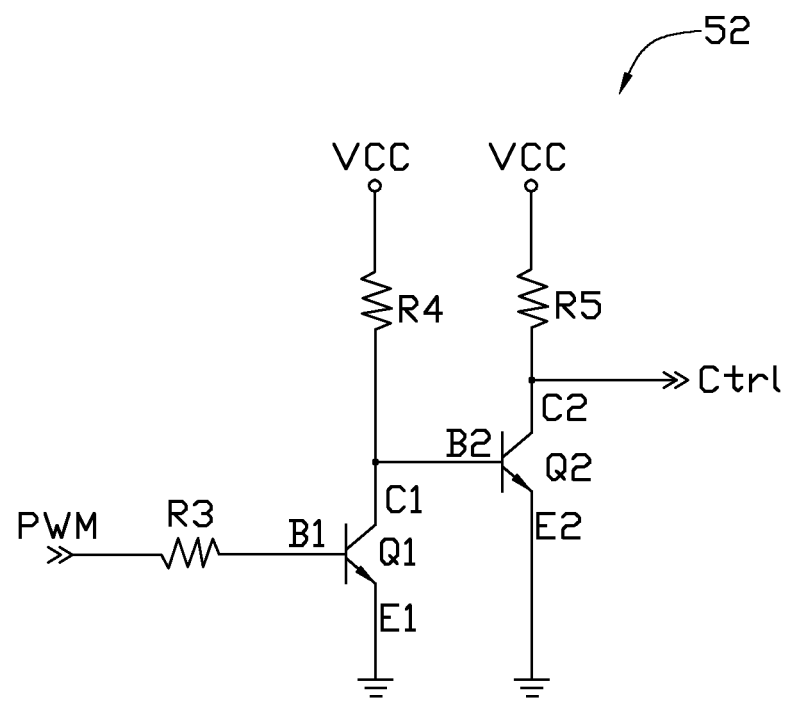
FIG. 3 is a circuit view of a signal generation circuit of the fan assembly as shown in FIG. 1.
Figure 4:
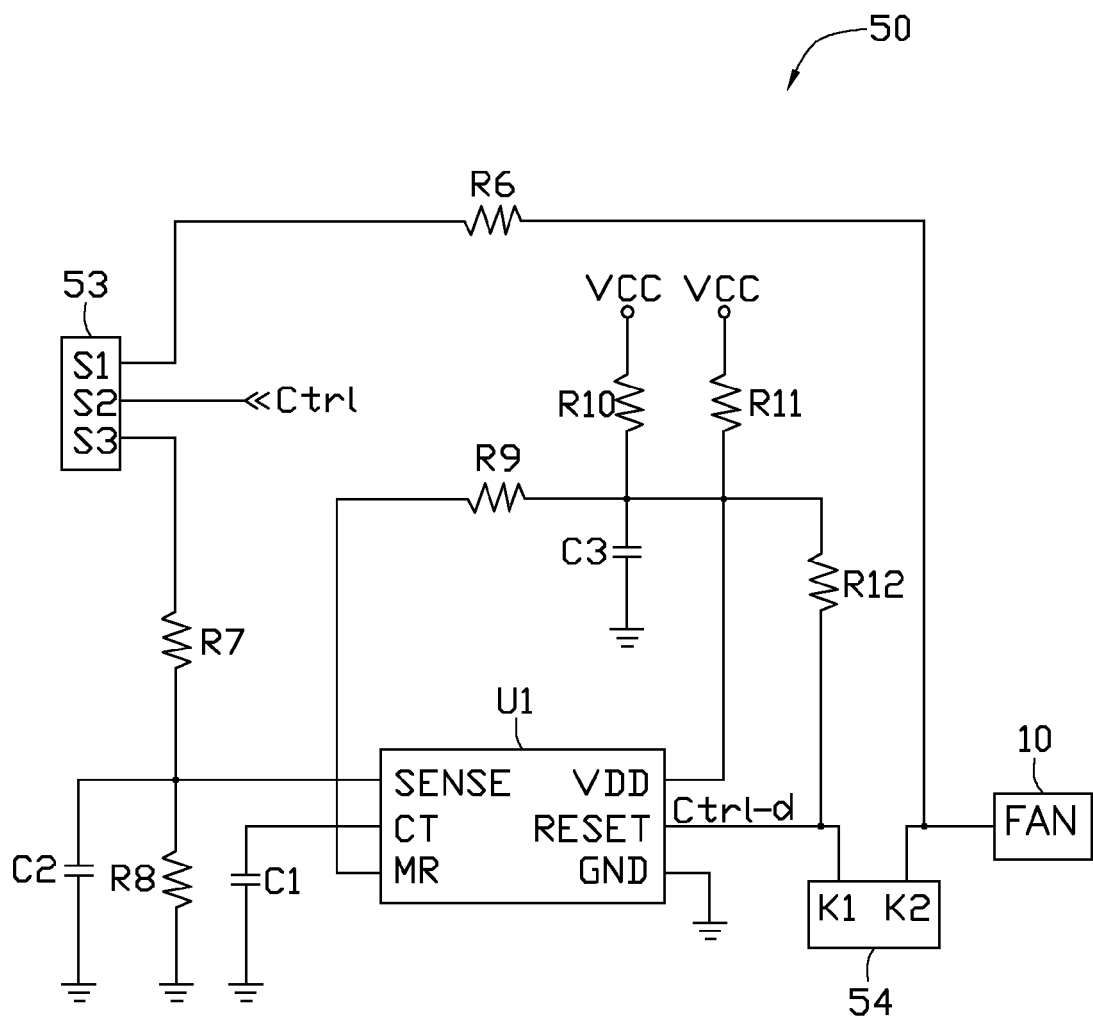
FIG. 4 is a circuit view of a delay circuit of the fan assembly as shown in FIG. 1.

FIGS. 2-4 show that the delay circuit 50 is configured to control the fan 10 to start. The delay circuit 50 includes a voltage conversion circuit 51, a signal generation circuit 52, a first switch 53, a second switch 54, a delay microchip U1, and peripheral circuits of the delay microchip U1.

The voltage conversion circuit 51 converts the voltage of about 12V into a driving voltage VCC of about 3.3V, to drive the signal generation circuit 52 and the delay microchip U1. The voltage conversion circuit 51 includes a first resistor R1 and a second resistor R2. The first resistor R1 and the second

2 resistor R2 are electronically connected in series between the voltage of about 12V and ground. Thus, the driving voltage VCC of about 3.3V is obtained from a node between the first resistor R1 and the second resistor R2.

The signal generation circuit 52 generates a control signal Ctrl according to the PWM signal. The signal generation circuit 52 includes a third resistor R3, a forth resistor R4, a fifth resistor R5, a first bipolar junction transistor (BJT) Q1, and a second BJT Q2.

The first BJT Q1 includes a base B1, an emitter E1 and a collector C1. The base B1 is electronically connected to the third resistor R3, and receives the PWM signal from the cable 30. The emitter E1 is connected to ground, and the collector C1 is electronically connected to the driving voltage VCC of about 3.3V via the fourth resistor R4. The second BJT Q2 includes a base B2, an emitter E2 and a collector C2. The base B2 is electronically connected to the collector C1, the emitter E2 is connected to ground, and the collector C2 is electronically connected to the driving voltage VCC of about 3.3V via the fifth resistor R5. In addition, the collector C2 outputs the control signal Ctrl. If the PWM signal is a high voltage signal (e.g., logic 1), the first BJT Q1 is turned on, and the second BJT Q2 is turned off, thus, the control signal Ctrl is a high voltage signal (e.g., 3V). If the PWM signal is a low voltage signal (e.g., logic 0), the first BJT Q1 is turned off, and the second BJT Q2 is turned on, thus, the control signal Ctrl is a low voltage signal (e.g., 0.7V). In one exemplary embodiment, the control signal Ctrl is a square wave.

In one exemplary embodiment, the first switch 53 is a single-pole double throw (SPDT) switch, and includes a first terminal S1, a second terminal S2, and a third terminal S3. The first terminal S1 is electronically connected to the fan 10 via a sixth resistor R6. The third terminal S3 is electronically connected to the peripheral circuits of the delay microchip U1. The second terminal S2 is electronically connected to the collector C2 of the second BJT Q2 to receive the control signal Ctrl. Additionally, the second terminal S2 is selectively and electronically connected to the first terminal S1 or the third terminal S3. Thus, the control signal Ctrl can be transmitted to the fan 10 via the first terminal S1, or can be transmitted to the peripheral circuits of the delay microchip U1 via the third terminal S3.

The delay microchip U1 is configured to delay the control signal Ctrl, and output a delayed control signal Ctrl-d accordingly. The delay microchip U1 includes an input pin SENSE, a voltage setting pin MR, a time setting pin CT, a power pin VDD, a ground pin GND, and an output pin RESET. The peripheral circuits of the delay microchip U1 includes a seventh resistor R7, a eighth resistor R8, a ninth resistor R9, a tenth resistor R10, a eleventh resistor R11, a twelfth resistor R12, a first capacitor C1, a second capacitor C2, and a third capacitor C3.

The seventh resistor R7 and the eighth resistor R8 are electronically connected in series between the third terminal S3 and ground. The input pin SENSE is electronically connected to a node between the seventh resistor R7 and the eighth resistor R8 to receive the control signal Ctrl, and is connected to ground via the second capacitor C2. The tenth resistor R10 and the third capacitor C3 are electronically connected in series between the driving voltage VCC and ground. The voltage setting pin MR is electronically connected to a node between the tenth resistor R10 and the third capacitor C3 via the ninth resistor R9. The power pin VDD is electronically connected to the driving voltage VCC via the eleventh resistor R11. The output pin RESET is electronically connected to the driving voltage VCC via the twelfth resistor R12 and the eleventh resistor R11, and is electronically connected to the node between the tenth resistor R10 and the third capacitor C3. The output pin RESET is configured to output the delayed control signal Ctrl-d.

The time setting pin CT is connected to ground via the first capacitor C1, and a delay time of the delay microchip U1 is determined by the capacitance value of the capacitor C1. In one exemplary embodiment, the capacitance value of the capacitor C1 is 18 nF, and the delay time of the delay microchip U1 is about 0.103 seconds. In other words, a time period between the delay microchip U1 receiving the control signal Ctrl and the delay microchip U1 outputting the delayed control signal Ctrl-d is about 0.103 S.

In one exemplary embodiment, the second switch 51 is a single-pole single-throw switch, and includes a fixing terminal K1 and a control terminal K2. The fixing terminal K1 is electronically connected to the output pin RESET of the delay microchip U1 to receive the delayed control signal Ctrl-d. The control terminal K2 is electronically connected to the fan 10. When the control terminal K2 is electronically connected to the fixing terminal K1, the fan 10 receives the delayed control signal Ctrl-d.

Before the electronic device 200 is turned on, if delay of the startup of the fan 10 is not needed, the first switch 53 can be manipulated (e.g., by manual operation) to allow the second terminal S2 to be electronically connected to the first terminal S1, and the second switch 54 can be manipulated to allow the control terminal K2 to be disconnected from the fixing terminal K1. Then, the control signal Ctrl output from the signal generation circuit 52 can be directly transmitted to the fan 10 via the first terminal S1 of the first switch 53. Thus, the fan 10 is activated. Additionally, the delay microchip U1 will not be interfered by the control signal Ctrl because the control terminal K2 is disconnected from the fixing terminal K1.

If delay of the startup of the fan 10 is needed, the first switch 53 can be manipulated to allow the second terminal S2 to be electronically connected to the third terminal S3, and the second switch 54 can be manipulated to allow the control terminal K2 to be electronically connected to the fixing terminal K1. Then, the control signal Ctrl output from the signal generation circuit 52 can be transmitted to the delay microchip U1 via the third terminal S3 and the input pin SENSE. After the predetermined delay time, the delay microchip U1 outputs the delayed control signal Ctrl-d to the fan 10 via the second switch 54 to activate the fan 10. Therefore, an instantaneous power consumption of the electronic device 200 may be decreased because of delay startup of the fan 10.

Additionally, the signal generation circuit 52 is electronically connected between the motherboard 220 and the delay microchip U1. Thus, a surge current output from the motherboard 220 will not directly incur damage of the delay microchip U1.

In other exemplary embodiments, the startup of other electronic components (e.g., network card or display card) can be delayed by the delay circuit 50.

In summary, the delay circuit 50 generates the control signal Ctrl according to the PWM signal, and delays the control signal Ctrl. Then, the delay circuit 50 outputs the delayed control signal Ctrl-d to the fan 10 to activate the fan 10. Thus, the fan 10 does not need to be simultaneously started with other components (e.g., hard disk drive) of the electronic device 200, and the instantaneous power consumption of the electronic device 200 is decreased. Therefore, the electronic device 200 is low in cost because the use of the power supply with high-power is not needed.

Although numerous characteristics and advantages of the exemplary embodiments have been set forth in the foregoing description, together with details of the structures and functions of the exemplary embodiments, the disclosure is illustrative only, and changes may be made in detail, especially in the matters of arrangement of parts within the principles of disclosure to the full extent indicated by the broad general meaning of the terms in which the appended claims are expressed.

What is claimed is:

1. A delay circuit for an electronic component of an electronic device, the delay circuit comprising:
    a signal generation circuit receiving a driving signal from the electronic device, and generating a control signal according to the driving signal;
    a first switch electronically connected to the signal generation circuit to receive the control signal;
    a delay microchip configured to delay the control signal; and
    a second switch electronically connected between the delay microchip and the electronic component;
    wherein manipulation of the first switch causes the signal generation circuit to be electronically connected to the electronic component via the first switch, and the control signal is transmitted to the electronic component to activate the electronic component; and
    wherein manipulation of the first switch causes the signal generation circuit to be electronically connected to the delay microchip, the delay microchip receives the control signal and outputs a delayed control signal after a predetermined delay time, and the delayed control signal is transmitted to the electronic component via the second switch to activate the electronic component.

2. The delay circuit as claimed in claim 1, wherein the signal generation circuit includes a first bipolar junction transistor (BJT), and a second BJT, the first BJT includes a base, an emitter and a collector, the second BJT includes a base, an emitter and a collector, the base of the first BJT receives the driving signal, the emitter of the first BJT is connected to ground, the collector of the first BJT is electronically connected to the base of the second BJT, the emitter of the second BJT is connected to ground, and the collector of the second BJT outputs the control signal.

3. The delay circuit as claimed in claim 2, wherein the first switch includes a first terminal, a second terminal, and a third terminal, the first terminal is electronically connected to the electronic component, the third terminal is electronically connected to the delay microchip, the second terminal is electronically connected to the collector of the second BJT, and the second terminal is selectively and electronically connected to the first terminal or the third terminal.

4. The delay circuit as claimed in claim 3, wherein the delay microchip includes an input pin and an output pin, the input pin is electronically connected to the second terminal of the first switch, and the output pin is electronically connected to the second switch.

5. The delay circuit as claimed in claim 4, wherein the delay microchip further includes a time setting pin, the time setting pin is connected to ground via a first capacitor, and the predetermined delay time of the delay microchip is determined by the capacitance value of the capacitor.

6. The delay circuit as claimed in claim 4, wherein the second switch includes a fixing terminal and a control terminal, the fixing terminal is electronically connected to the output pin of the delay microchip, and the control terminal is electronically connected to the electronic component.

7. The delay circuit as claimed in claim 1, further comprising a voltage conversion circuit, the voltage conversion circuit converts the voltage output from the motherboard into a driving voltage to drive the signal generation circuit and the delay microchip.

8. A fan assembly used in an electronically device, the fan assembly comprising:
a fan; and
a delay circuit, the delay circuit comprising:
a signal generation circuit receiving a driving signal from the electronic device, and generating a control signal according to the driving signal;
a first switch electronically connected to the signal generation circuit to receive the control signal;
a delay microchip configured to delay the control signal; and
a second switch electronically connected between the delay microchip and the fan;
wherein manipulation of the first switch causes the signal generation circuit to be electronically connected to the fan via the first switch, and the control signal is transmitted to the fan to activate the fan; and
wherein manipulation of the first switch causes the signal generation circuit to be electronically connected to the delay microchip, the delay microchip receives the control signal and outputs a delayed control signal after a predetermined delay time, and the delayed control signal is transmitted to the fan via the second switch to activate the fan.

9. The fan assembly as claimed in claim 8, further comprising a connector and a cable, wherein the connector is formed on a first end of the cable, and is configured to receive the drive signal, a second end of the cable is electronically connected to the delay circuit and the fan.

10. The fan assembly as claimed in claim 9, wherein the first switch includes a first terminal, a second terminal, and a third terminal, the first terminal is electronically connected to the fan, the third terminal is electronically connected to the delay microchip, the second terminal is electronically connected to the collector of the second BJT, and the second terminal is selectively and electronically connected to the first terminal or the third terminal.

11. The fan assembly as claimed in claim 10, wherein the delay microchip includes an input pin and an output pin, the input pin is electronically connected to the second terminal of the first switch, and the output pin is electronically connected to the second switch.

12. The fan assembly as claimed in claim 11, wherein the delay microchip further includes a time setting pin, the time setting pin is connected to ground via a first capacitor, and the predetermined delay time of the delay microchip is determined by the capacitance value of the capacitor.

13. The fan assembly as claimed in claim 11, wherein the second switch includes a fixing terminal and a control terminal, the fixing terminal is electronically connected to the output pin of the delay microchip, and the control terminal is electronically connected to the fan.

14. The fan assembly as claimed in claim 8, further comprising a control board, wherein the control board is fixed to the fan, and the delay circuit is integrated on the control board.

15. The fan assembly as claimed in claim 8, wherein the signal generation circuit includes a first bipolar junction transistor (BJT), and a second BJT, the first BJT includes a base, an emitter and a collector, the second BJT includes a base, an emitter and a collector, the base of the first BJT receives the driving signal, the emitter of the first BJT is connected to ground, the collector of the first BJT is electronically connected to the base of the second BJT, the emitter of the second BJT is connected to ground, and the collector of the second BJT outputs the control signal.

16. An electronic device, comprising:
a motherboard outputting a driving signal;
a fan; and
a delay circuit, the delay circuit comprising:
a signal generation circuit receiving a driving signal from the motherboard, and generating a control signal according to the driving signal;
a first switch electronically connected to the signal generation circuit to receive the control signal;
a delay microchip configured to delay the control signal; and
a second switch electronically connected between the delay microchip and the fan;
wherein manipulation of the first switch causes the signal generation circuit to be electronically connected to the fan via the first switch, and the control signal is transmitted to the fan to activate the fan; and
wherein manipulation of the first switch causes the signal generation circuit to be electronically connected to the delay microchip, the delay microchip receives the control signal and outputs a delayed control signal after a predetermined delay time, and the delayed control signal is transmitted to the fan via the second switch to activate the fan.

17. The electronic device as claimed in claim 16, wherein the signal generation circuit includes a first bipolar junction transistor (BJT), and a second BJT, the first BJT includes a base, an emitter and a collector, the second BJT includes a base, an emitter and a collector, the base of the first BJT receives the driving signal, the emitter of the first BJT is connected to ground, the collector of the first BJT is electronically connected to the base of the second BJT, the emitter of the second BJT is connected to ground, and the collector of the second BJT outputs the control signal.

18. The electronic device as claimed in claim 17, wherein the first switch includes a first terminal, a second terminal, and a third terminal, the first terminal is electronically connected to the fan, the third terminal is electronically connected to the delay microchip, the second terminal is electronically connected to the collector of the second BJT, and the second terminal is selectively and electronically connected to the first terminal or the third terminal.

19. The electronic device as claimed in claim 18, wherein the delay microchip includes an input pin and an output pin, the input pin is electronically connected to the second terminal of the first switch, and the output pin is electronically connected to the second switch.

20. The electronic device as claimed in claim 19, wherein the second switch includes a fixing terminal and a control terminal, the fixing terminal is electronically connected to the output pin of the delay microchip, and the control terminal is electronically connected to the fan.

* * * * *